(12) United States Patent
Furey et al.

(10) Patent No.: US 8,376,479 B2
(45) Date of Patent: Feb. 19, 2013

(54) HIGH END ROBUST COMPUTER FRAME WITH IMPROVED LOAD BALANCING DESIGN

(75) Inventors: Edward F. Furey, Kingston, NY (US); Robert K. Mullady, Highland, NY (US); Steven C. McIntosh, Kingston, NY (US); Budy D. Notohardjono, Poughkeepsie, NY (US); Kevin R. Qualters, LaGrangeville, NY (US); Howard P. Welz, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 786 days.

(21) Appl. No.: 11/947,385

(22) Filed: Nov. 29, 2007

(65) Prior Publication Data

US 2009/0139887 A1    Jun. 4, 2009

(51) Int. Cl.
*A47B 81/00*    (2006.01)
(52) U.S. Cl. .................. 312/265.4; 312/351.7; 414/542; 248/678; 211/26
(58) Field of Classification Search .............. 312/257.1, 312/265.1, 265.2, 265.4, 237, 223.2, 351.1, 312/351.2, 351.7; 361/679.02; 414/541, 414/542; 211/26; 212/71; 108/51.11, 57.1; 248/637, 678, 346.01, 346.03
See application file for complete search history.

(56) References Cited

U.S. PATENT DOCUMENTS

| | | | | | |
|---|---|---|---|---|---|
| 3,405,666 | A | * | 10/1968 | Miller | 108/57.1 |
| 3,493,201 | A | * | 2/1970 | Marran | 248/678 |
| 3,857,494 | A | * | 12/1974 | Giardini | 211/194 |
| 5,062,760 | A | * | 11/1991 | Samaniego | 414/542 |
| 5,165,770 | A | * | 11/1992 | Hahn | 312/265.4 |
| 5,429,253 | A | * | 7/1995 | McNett | 212/253 |
| 5,533,456 | A | * | 7/1996 | Regina | 108/57.29 |
| 5,590,938 | A | * | 1/1997 | De Andrea | 312/257.1 |
| 5,743,702 | A | * | 4/1998 | Gunderson | 414/542 |
| 6,041,949 | A | * | 3/2000 | Walker et al. | 212/179 |
| 6,164,460 | A | * | 12/2000 | Reuter | 211/26 |
| 6,293,637 | B1 | * | 9/2001 | Anderson et al. | 312/265.1 |
| 6,425,648 | B1 | * | 7/2002 | Notohardjono et al. | 312/265.4 |
| 6,875,935 | B2 | * | 4/2005 | Abrahamsen et al. | 200/50.24 |
| 6,890,045 | B2 | * | 5/2005 | Klassen | 312/351.3 |
| 7,048,491 | B2 | * | 5/2006 | Windbergs | 414/542 |

* cited by examiner

*Primary Examiner* — James O Hansen
(74) *Attorney, Agent, or Firm* — Dennis Jung; Ido Tuchman

(57) ABSTRACT

A load balancing method and incorporated frame assembly is provided for a computer frame having side walls. The frame can have at least one reinforced side, and/or a top or bottom surface comprising of a skin base plate and a counterweight plate secured to one another by side stiffener plates. In an alternate embodiment, an integral extender can also be secured to a top portion of the frame. The extender has moveable sides and a hoist for raising and lowering components into and away from the frame.

18 Claims, 8 Drawing Sheets

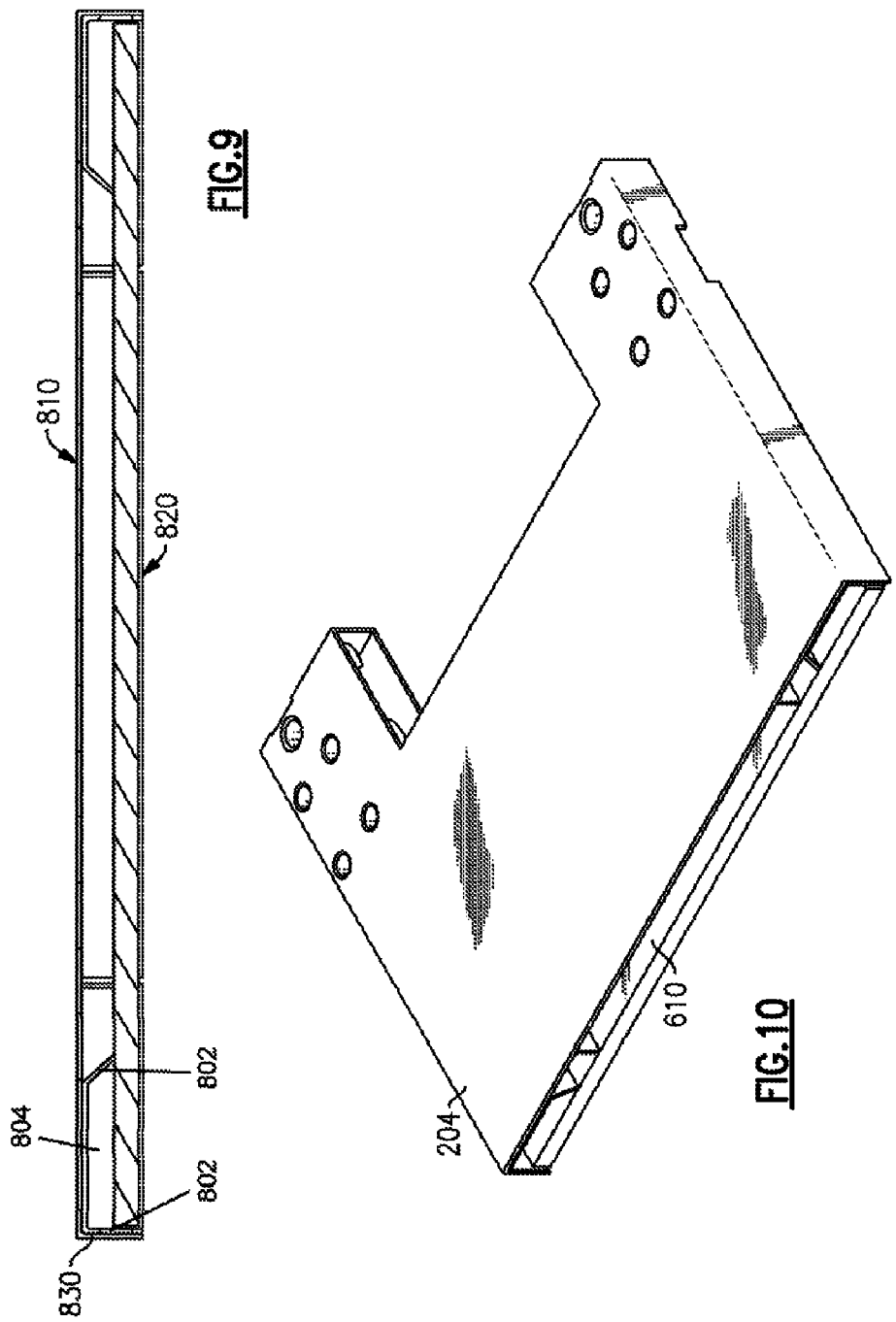

HIGH END ROBUST COMPUTER FRAME WITH IMPROVED LOAD BALANCING DESIGN

BACKGROUND OF THE INVENTION

1. Field of the Invention

This invention relates to packaging of computing systems and more particularly to packaging of large computing systems that utilize frames and cages.

2. Description of Background

The industry trend has been to continuously increase the number of electronic components inside computing systems. This continuous increase, however, creates many challenges for the designers of these systems. A number of issues, including but not limited to heat dissipation, load balancing, electromagnetic interruptions, and even noise management, must be addressed when designing large systems. Furthermore, price constraints and performance needs as well as other factors such as packaging density, scalability and availability place additional demands on the designs of these packages.

The end result is often heavy units that have to be shipped, installed and serviced with great difficulty. Often two or more service personnel using a multitude of devices such as independent hoists have to be provided for installation and service of these units. Consequently, due to the difficulty of installation and servicing of these units, service and installation calls are delayed, which in turn affect system availability for the customer(s). In conclusion, there is a need for a better method and design that can simplify installation and service procedures when using large computers.

SUMMARY OF THE INVENTION

The shortcomings of the prior art are overcome and additional advantages are provided through the provision of a load balancing method and incorporated frame assembly is provided for a computer frame having side walls. The frame can have at least one reinforced side, and/or a top or bottom surface comprising of a skin base plate and a counterweight plate secured to one another by side stiffener plates. In an alternate embodiment, an integral extender can also be secured to a top portion of the frame. The extender has moveable sides and a hoist for raising and lowering components into and away from the frame.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 9, provides an illustration of an assembled reinforced side as per embodiment of FIG. 10; and FIG. 10 is a perspective top-down illustration of a top or bottom computer frame or rack as per embodiment of FIG. 6.

DESCRIPTION OF THE INVENTION

Figure 1:
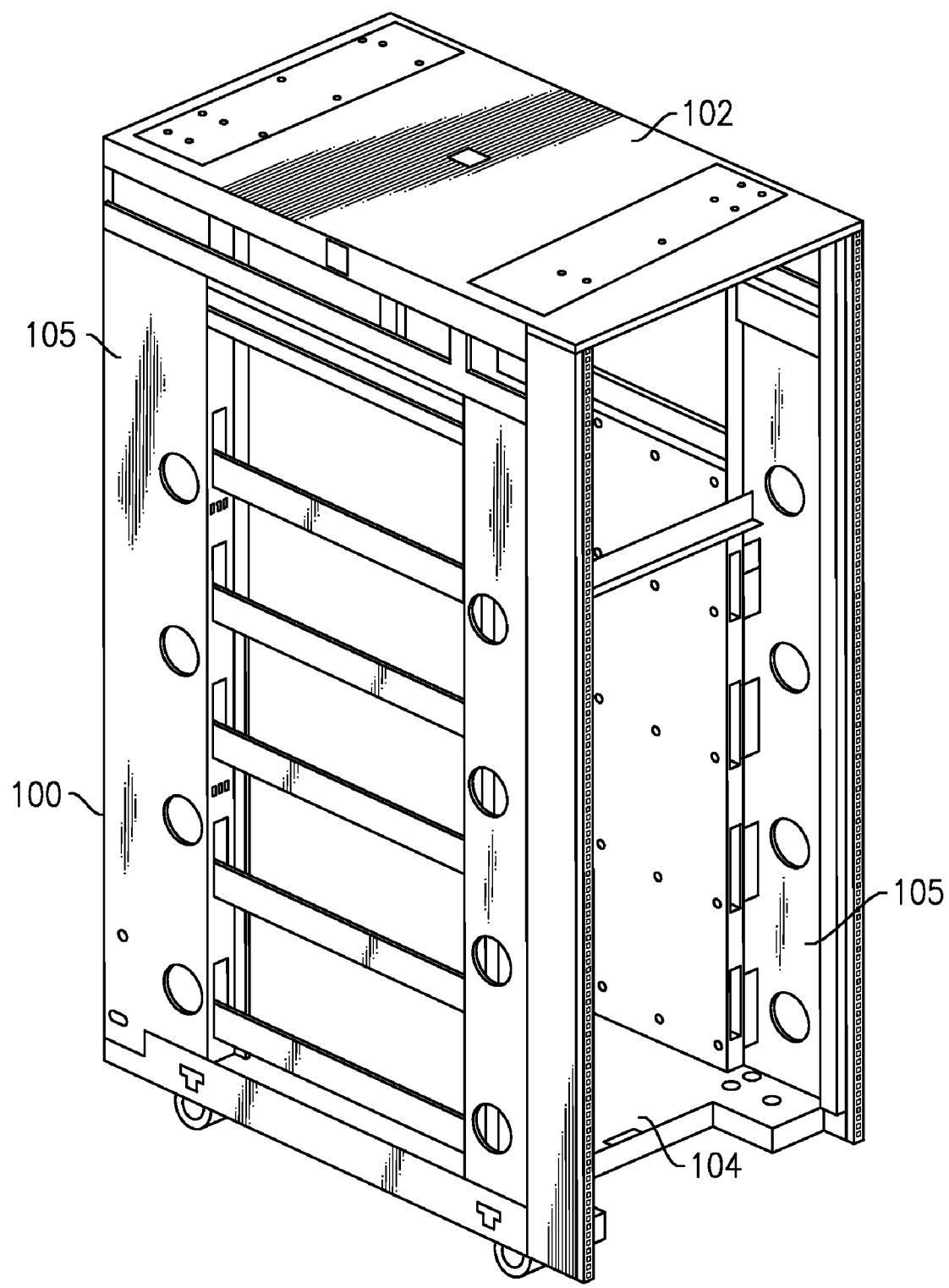
FIG. 1 is a perspective side view illustration of a computer frame such as the one used in conjunction with one embodiment of the present invention.

FIG. 1 is a perspective side view illustration of a computer frame, referenced as 100, such as the one used in conjunction with sophisticated computing system environments. The illustrated frame 10 have a cage like structure, with sidewalls, referenced as 105 and top and bottom surfaces, referenced as 102 and 104 respectively. This particular frame structure (i.e. cage) is provided for ease of visual understanding only and other frame structures and arrangements are possible when used with alternate embodiments. In addition, while the illustrated frame does not include any covers or doors, it is possible to incorporate such design in alternate embodiments. In many instances the frame or rack is populated by one or more electronic components that can be housed on mother board, electronic cards and the like. This will render the frame heavy and difficult to transport and service.

Figure 2:
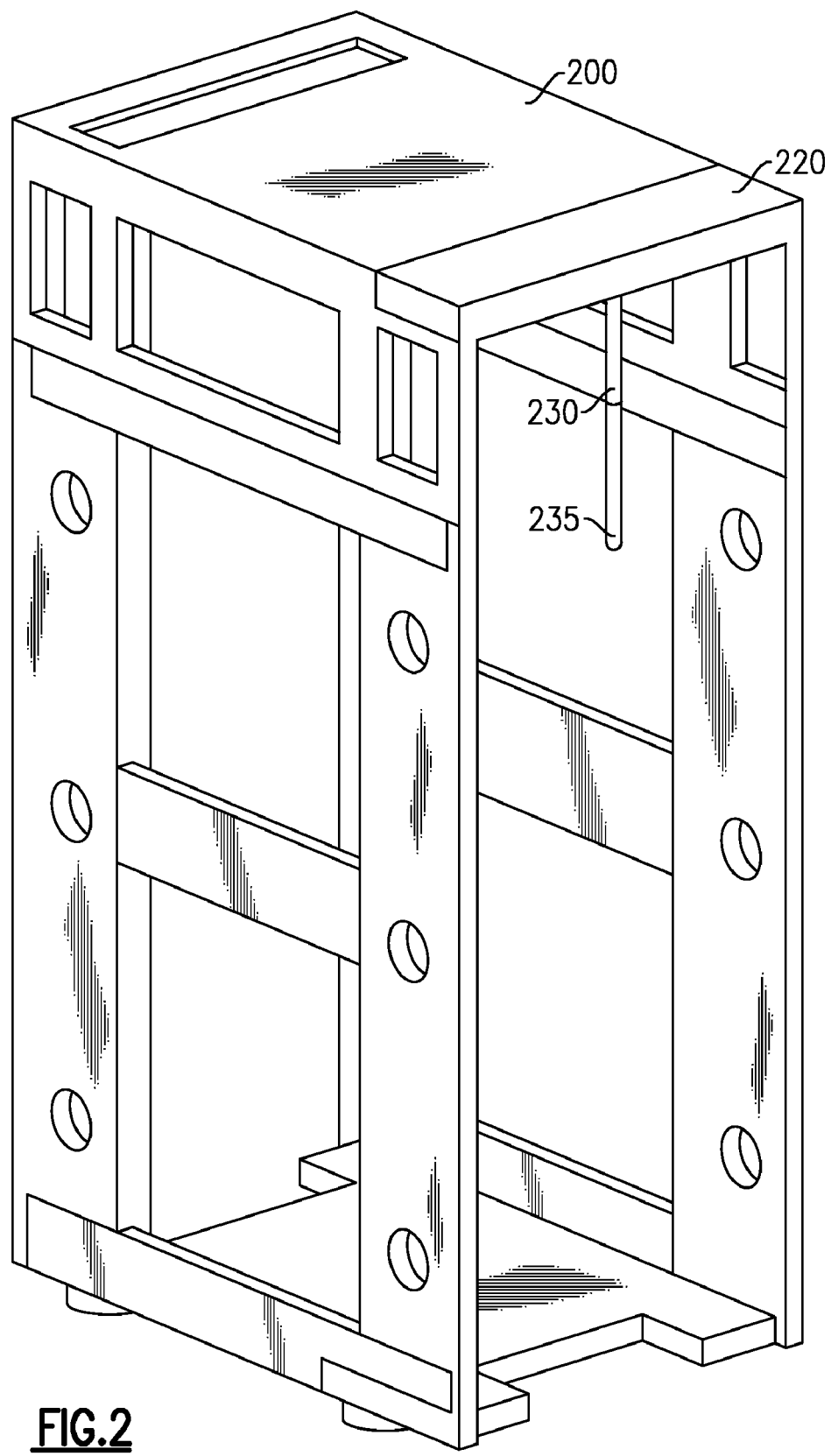
FIG. 2 is a perspective illustration of an enhanced rack as per one embodiment of the present invention.

FIG. 2 is a perspective illustration of an enhanced rack 200 as per one embodiment of the present invention. The rack 200 has an extender that can slide out of the rack 200. The extender is referenced by numerals 220 and is designed such that it has become an integral part of the rack. The extender 200 can be a separate portion that is disposed on the frame and then secured by means as known to those skilled in the art.

The extender 220 also has a built in hoist, referenced by numerals 230 as shown, that is disposed on its extending side. The hoist, can also have a connector end such as the hook shown in the figure. The hoist is referenced by numerals 230 and the connector or hook by numerals 235 in the figure as shown.

Figure 3:
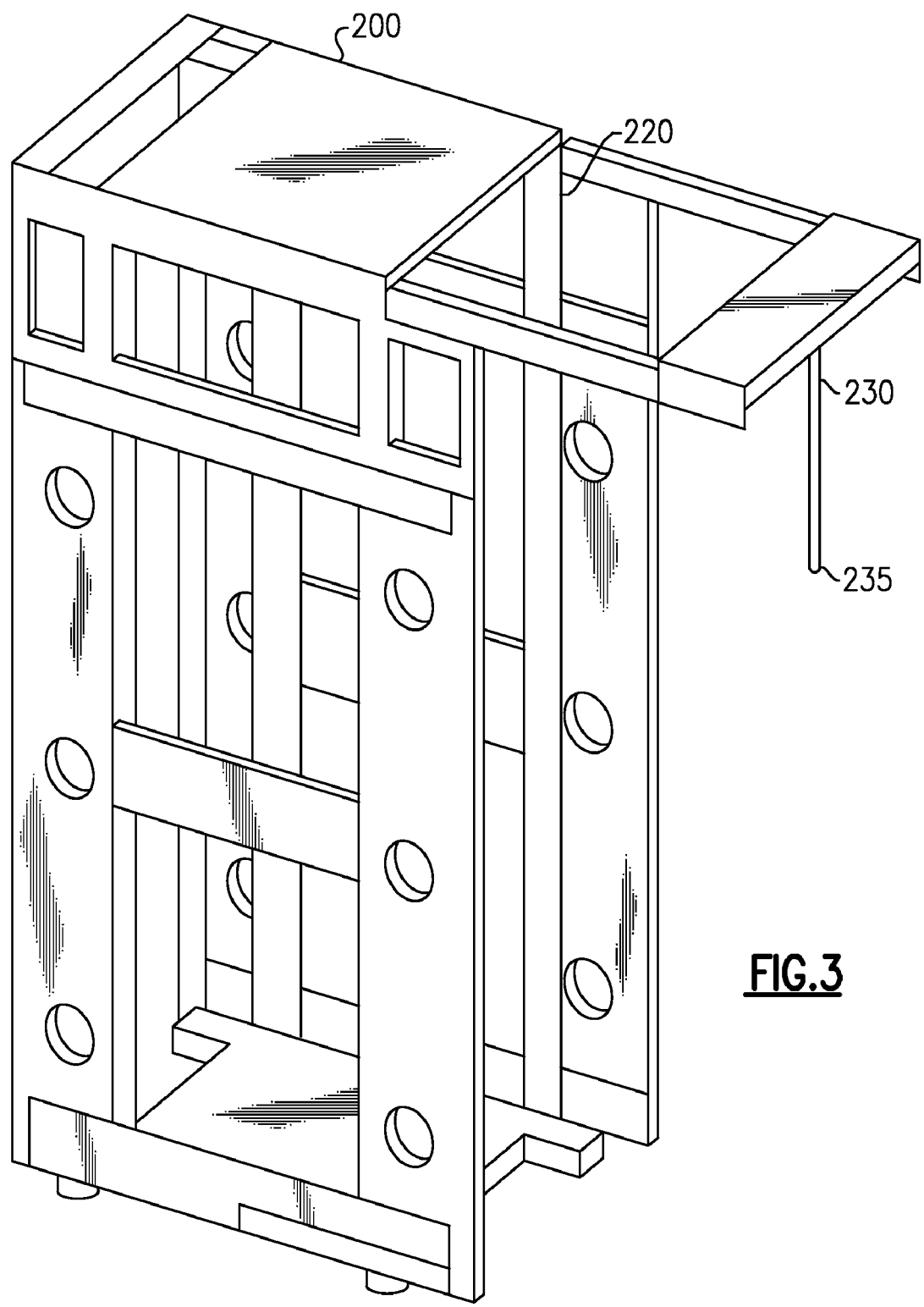
FIG. 3 provides another perspective illustration of the enhanced rack of FIG. 2 but at a time when the extender has been extended.

FIG. 3 provides another perspective illustration of the enhanced rack 200 of FIG. 2 but at a time when the extender 220 has been extended. As shown in the figure, the hoist 220 can be extended out by sliding it out and away from the frame and the hoist 230 also is extended out as can be seen from the illustration. The connector or in this embodiment, the hook 235 of the hoist 230 can be used to connect any to be installed/removed assembly to the rack or frame during service calls (or original installation).

Figure 4:
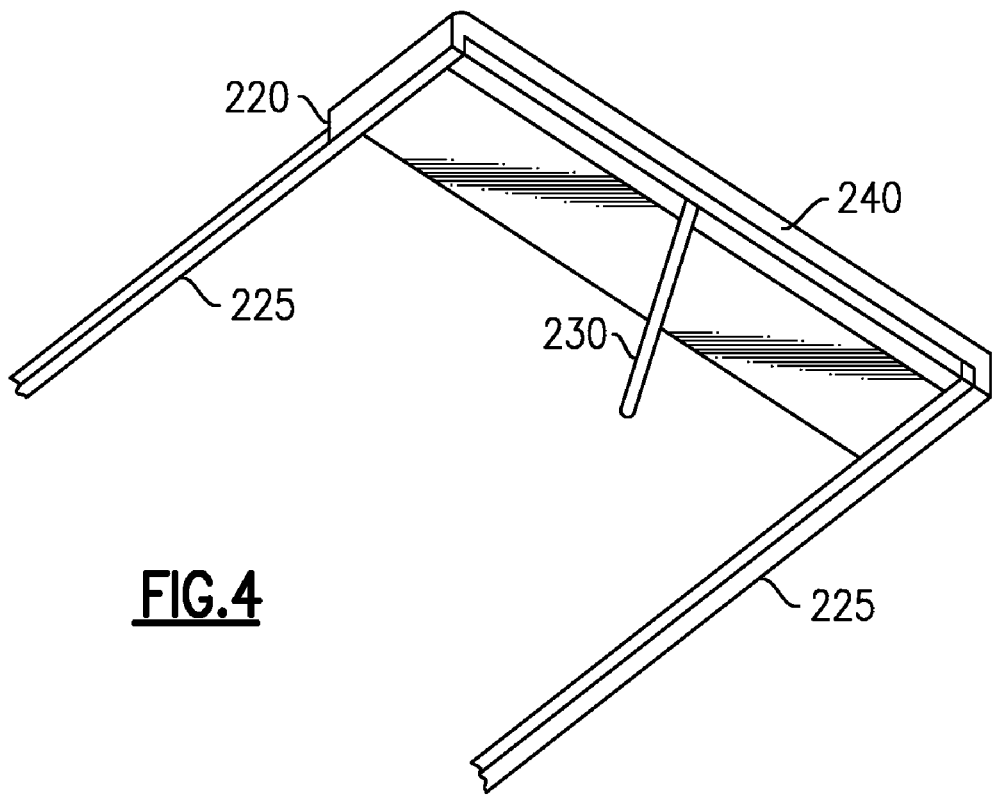
FIGS. 4 and 5 provide a more detailed view of the extender of FIG. 3 including the gear mechanism.
Figure 5:
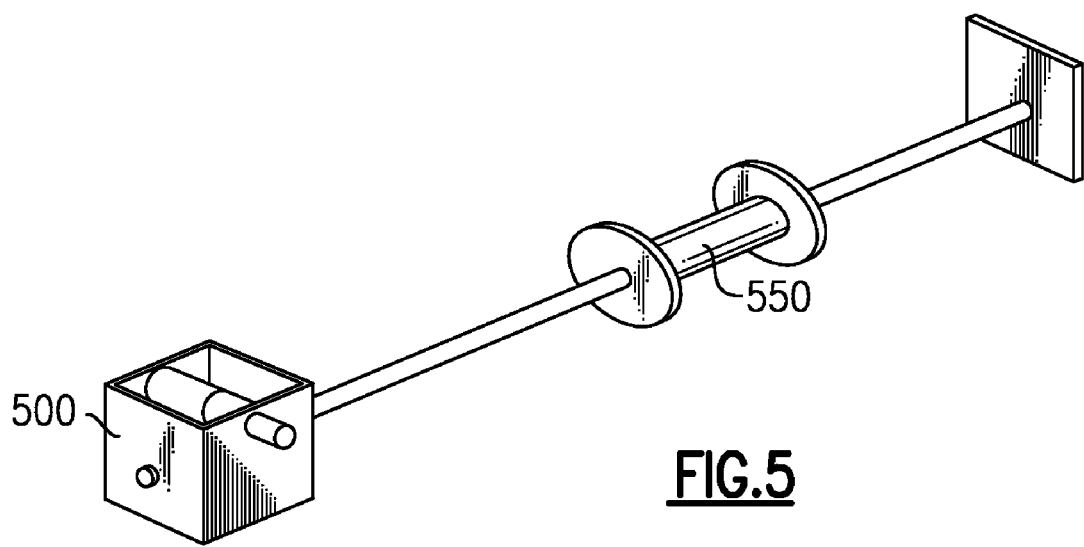

FIGS. 4 and 5 provide a more detailed view of the extender 220. In FIG. 4, the illustration show more clearly that the extender 220 further comprise of a plurality of moveable portions 225 which are secured to the rack at one end and to a stationary portion 240 from which the built in hoist 230 is disposed from. The moveable portions 225 can be moved from a first to a second positions (or open and closed positions) or preferably be slidable sides that can be moved to a variety of positions during the sliding motion. It is also clear from looking at FIGS. 4 and 5 together that the extender 220 can include a hoist with rack and pinion gear, in one embodiment, that can bring the heavy electronic assembly from the floor up or bring down the assembly during installation and removal of the assembly.

FIG. 5 provides for a side view illustration of the gear drive mechanism 500 (also gear mechanism) that can be connected to a variety of locations including the stationary portion 240 and that can move the connector or hook 235 from a first to a second position (in this case up and down). In one embodiment, at a selective point but preferably a midpoint of the mechanism is a spool 550 where the connector/hook 235 will be connected. The hoist line 235 would then revolve around the spool through the use of the mechanism to lower or raise the connector/hook.

To further enhance the serviceability features and add to the robustness and structural integrity of the frame 200, in an alternate embodiment as shown in FIGS. 6 through 10, a method and associated assembly is provided that allows construction of a more robust frame and more serviceable frame is provided. The embodiments as will be discussed presently in conjunction with FIGS. 6 through 10 can be implemented alone, or combined with those already discussed above in conjunction with FIGS. 1-5.

One associated benefit of the alternate embodiments of FIGS. 6 through 10 is that it produces sufficient structural rigidity that the frame can withstand a variety of extreme conditions, ranging from instances where the frame is exposed to continuous vibrations (such as in naval ships and airplanes) to situations where the frame sustains a sudden shock, such as during natural disasters (i.e. earthquakes, tornadoes, hurricanes etc.)

Figure 6:
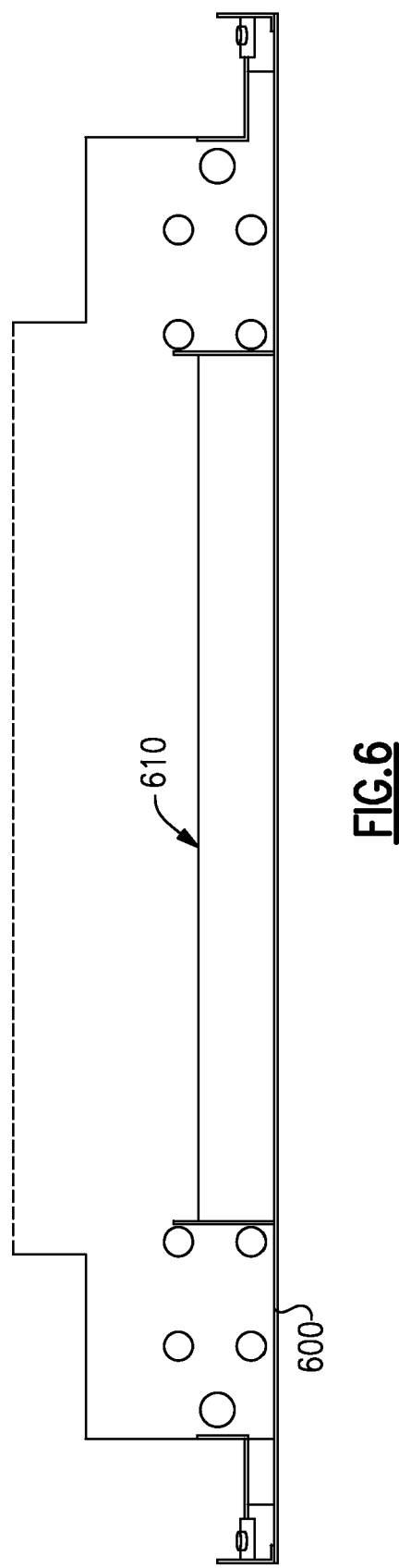
FIG. 6 is a cross-sectional side view of a reinforced computer frame side or surface as per one embodiment of the present invention.

One objective behind the design of this alternate embodiment is to achieve structural rigidity while not substantially increasing the weight of the assembly. If substantial weight is added to the assembly, transportation and maintenance of the assembly becomes more complicated. Weight issues also further impact the load balancing situation as discussed. To achieve a light weight but a stiff structure, in one embodiment as shown in FIGS. 6 through 10, a double wall construction is provided that is preferably made out of sheet metal or sheet metal components. FIG. 6 provides for a cross sectional illustration of this double wall embodiment.

In the alternate embodiment of FIG. 6, a surface of the computer frame is enforced using a double wall structure. The frame can be similar to the one shown and discussed in conjunction with FIGS. 1-5 and therefore for ease of understanding and consistency, this frame is also hereinafter referenced as 200.

The frame surface, 600, is used representatively to include sidewalls and/or top or bottom frame sides. In FIG. 6, the double wall structure of the reinforced side 600 is further referenced by numerals 610 and comprises of an enclosure. FIG. 9 provides a better view of this enclosure.

Figure 7:
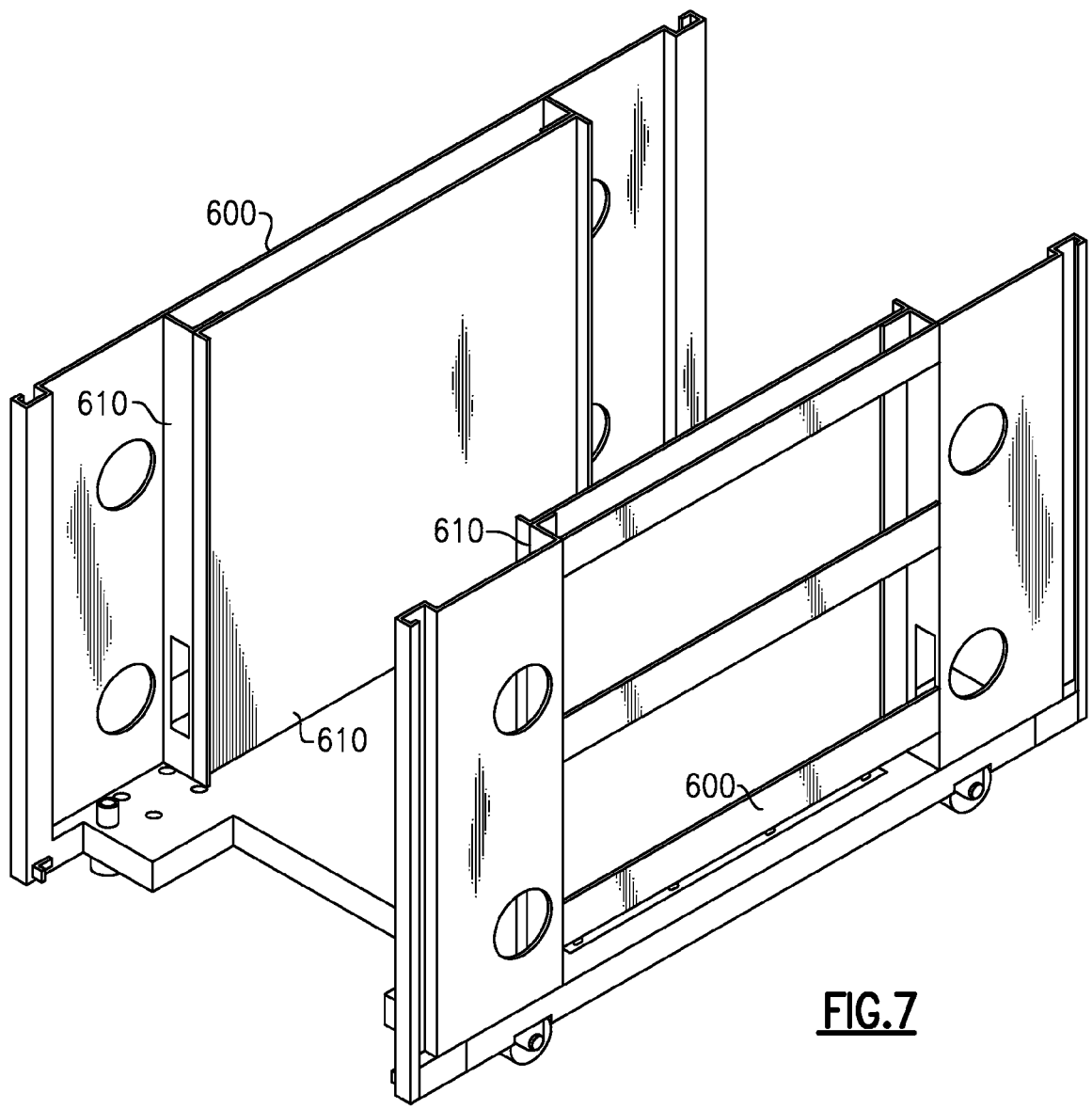
FIG. 7 is an illustration of a perspective side view of a portion of the frame as per embodiment of FIG. 6.

In FIG. 7 a perspective side view of a portion of the frame 200 having the enhanced double walled structure (also hereinafter referenced as boxed structure) is shown. It should be noted, that each frame surface or a plurality of them can incorporate the double wall/boxed 610 design selectively.

When implemented in more than one side of the frame 200, the structural box 610 that is built into the surfaces 600, will greatly help increases the rigidity of the frame. The double wall (sheet metal) construction increases the moment of inertia or the stiffness of the rack 200 (FIG. 1) without adding significantly the total weight of the whole rack. To survive lateral movement such as due to earthquake the stability or the location of the center gravity is critical parameter. The space allocated inside the double wall construction will allow maximum rigidity while allowing for minimum weight increase.

Figure 8:
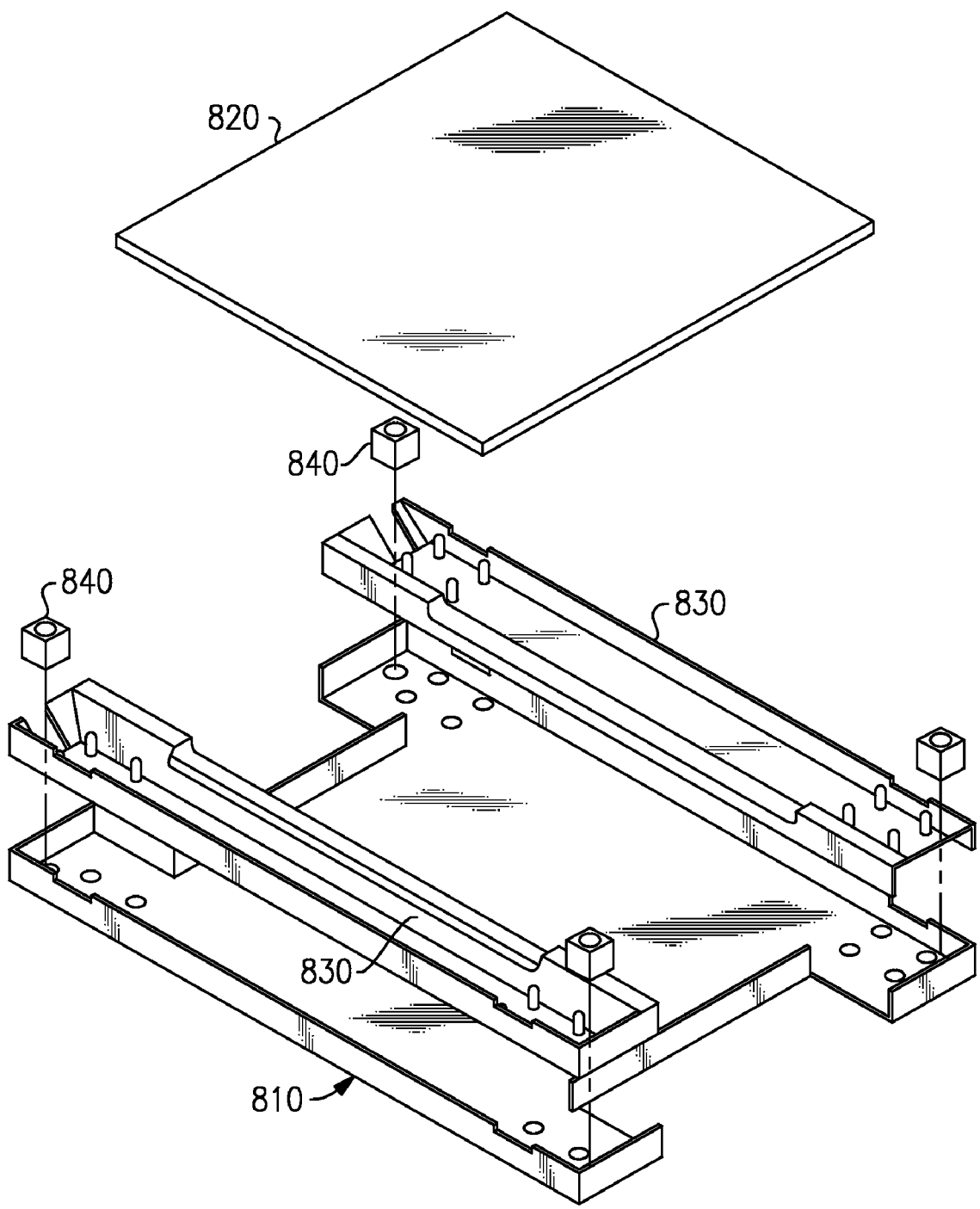
FIG. 8 a more detailed illustration of the structure of the reinforced side as per embodiment of FIG. 6.

FIG. 8 provides further details of the structure of the box 610. As an example, the box design in this case will be implemented in conjunction with a bottom portion of the rack 200.

The structure of the double wall or box 10 comprises a base skin plate, referenced as 810 and a counterweight plate 820 attached to one another by a plurality of sides stiffeners 830 in a manner such that they form an enclosure. In one embodiment, the plates 810 and 820 will secured on their sides by the stiffeners 830.

In one embodiment, the plates are the two parallel sides of a parallelogram. In a preferred embodiment, the parallelogram is a rectangular box, and the stiffeners 830 are connected perpendicularly to the plates. In another embodiment, it is possible to secure the two parallel plates such that a portion of the plates hand over the stiffeners 830, therefore making a substantially boxed structure.

The plates 810, 820 and 830 are secured to one another using fastening means as known to those skilled in the art. In one example, as provided in FIG. 8, the fastening means shown are nut bolts 840, but in alternate embodiments other means can be used. The assembled box structure 610 is shown in the side view illustration of FIG. 9. The plates 810 and 820 are assembled together by use of stiffeners 830 as shown. The stiffeners 830 include struts 802 supporting the top plate over the bottom plate, with the struts 802 forming a channel 804.

FIG. 10 provides a perspective top-down view of a top or bottom rack side for ease of understanding. Since some emphasis was placed on the side view and rack side discussion, it was deemed useful to also present a similar discussion for the top and bottom of the rack. In FIG. 10, for ease of understanding, it will be assumed that the box structure 610 was provided on the bottom of the rack, referenced 204.

In this case, to increase stability the bottom of the rack has a single piece, preferably made of steel or steel components, that acts as stiffening structure of the rack bottom where normally the rack is bolted to the floor. In addition the added mass at the bottom of the rack also lower the center of gravity (i.e. the stability of the rack.) The double wall box structure proposed has added advantage such as reduce welding and also reduce machining such as post weld grinding operation. Thus the double wall box structure achieve optimum stiffness, weight, stability without growing any external dimension While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer frame comprising:
    a top member;
    a plurality of side members coupled to the top member;
    an extender slidable into and out of the top member, the extender including a hoist configured to bring an electronic assembly up and down the computer frame; and
    a base member coupled to and supporting the side members, the base member comprising:
        a bottom plate;
        a top plate coupled to the bottom plate, the bottom plate and top plate forming a chamber; and
        a plurality of stiffener plates disposed between the bottom plate and the top plate, each of the stiffener plates including struts supporting the top plate over the bottom plate, the struts forming a channel.

2. The computer frame of claim 1, wherein said top plate, bottom plate and stiffener plates form a rectangular box.

3. The computer frame of claim 1 wherein said stiffener plates are comprised of metal or metal components.

4. The computer frame of claim 1 wherein said extender has a plurality of moveable sides, said moveable sides capable of extending from a first to a second position.

5. The computer frame of claim 4 wherein said positions comprise an open and closed position.

6. The computer frame of claim 5 wherein said extender is secured at a first end to said computer frame such that when said extender is closed, said extender becomes an integral part of said computer frame.

7. The computer frame of claim 6 wherein said moveable sides can slide from a closed position to an open position and other positions in between.

8. The computer frame of claim 6, wherein said moveable sides are disposed at a second end to a stationary member.

9. The computer frame of claim 8 wherein said hoist is disposed on said stationary member.

10. The computer frame of claim 9 wherein said hoist includes a connector for hoisting objects away and onto said rack.

11. The computer frame of claim 10 wherein said connector is a hook.

12. The computer frame of claim 11, wherein said hoist includes a gear mechanism for raising and lowering said hook.

13. The computer frame of claim 12, wherein said mechanism also includes a spool such that a hoist line can be rolled around it during lowering and raising of the hoist.

14. An apparatus used for installation and removal of electronic components onto/from a computer rack comprising:
an extender disposed on top portion of said rack such that said extender is an integral portion of said rack; said extender having a plurality of slidable sides connected at one side to said rack and at other end to a stationary member housing a hoist, the extender slidable into and out of the top portion, the hoist carried by the extender, the hoist configured to bring an electronic assembly up and down the computer frame; and
a base member coupled to the extender, the base member comprising:
a bottom plate;
a top plate coupled to the bottom plate, the bottom plate and top plate forming a chamber; and
a plurality of stiffener plates disposed between the bottom plate and the top plate, each of the stiffener plates including struts supporting the top plate over the bottom plate, the struts forming a channel.

15. The apparatus of claim 14 wherein said hoist has a connector at its end.

16. The apparatus of claim 15 wherein said connector is a hook.

17. The apparatus of claim 16 wherein said hoist has a gear mechanism for raising and lowering of said hook.

18. A method of providing a computer frame having side and top and bottom surfaces, the method comprising the steps:
reinforcing a base member of the computer frame with a bottom plate, a top plate coupled to the bottom plate and a plurality of stiffener plates, the bottom plate and top plate forming a chamber, the stiffener plates disposed between the bottom plate and the top plate, each of the stiffener plates including struts supporting the top plate over the bottom plate, the struts forming a channel; and
activating a hoist configured to bring an electronic assembly up and down the computer frame, the hoist slidable into and out of the computer frame.

* * * * *